(12) United States Patent
Matsuo et al.

(10) Patent No.: US 6,356,490 B1
(45) Date of Patent: Mar. 12, 2002

(54) SEMICONDUCTOR DEVICE, TESTING DEVICE THEREOF AND TESTING METHOD THEREOF

(75) Inventors: Shoichi Matsuo; Tsuneo Abe, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/570,377

(22) Filed: May 12, 2000

(30) Foreign Application Priority Data

Dec. 5, 1999 (JP) .......................................... 11-131164

(51) Int. Cl.⁷ ................................................ G11C 7/00
(52) U.S. Cl. ........................................ 365/201; 714/718
(58) Field of Search ........................... 365/201; 714/718

(56) References Cited

U.S. PATENT DOCUMENTS 5,535,165 A  *  7/1996  Davis et al. ................. 365/201
6,154,860 A  * 11/2000  Wright et al. ............... 365/201

* cited by examiner

*Primary Examiner*—Vu A. Le
*Assistant Examiner*—Van Thu Nguyen
(74) *Attorney, Agent, or Firm*—Sughrue Mion, PLLC

(57) ABSTRACT

A semiconductor device is provided with a memory cell array, an interface circuit portion and a control circuit. The interface circuit portion controls input and output of a signal between the memory array and an external circuit. The control circuit controls operating states of the interface circuit portion independently of the memory cell array based on an externally inputted signal.

12 Claims, 5 Drawing Sheets

US 6,356,490 B1

SEMICONDUCTOR DEVICE, TESTING DEVICE THEREOF AND TESTING METHOD THEREOF

BACKGROUND OF THE INVENTION

1. Field of the Invention

The present embodiment relates to a semiconductor device in which a memory is incorporated, a testing device thereof and a testing method thereof, and, specifically, relates to a semiconductor device wherein a burn-in test is performed on a interface circuit portion to improve reliability, a testing device thereof and a testing method thereof.

2. Description of the Related Art

After a semiconductor device such as a dynamic random access memory (DRAM) is produced, a burn-in test (screening) is performed wherein the semiconductor device is heated to a high temperature and an accelerated test is performed for operations thereof. FIG. 1 is a block diagram showing a method for an operation test by the burn-in test. FIG. 2 is a block diagram showing a configuration of the conventional semiconductor device.

Formerly, when performing an operation test on a semiconductor device, in the order of 100 through 200 semiconductor devices to be tested 51 are connected to the semiconductor testing device 54 in parallel with each other. On a part of the terminals of the semiconductor device to be tested 51, stress voltage is impressed at all times and the stress voltage is impressed up to a part of internal circuits of the semiconductor device to be tested 51 in accordance with the rise or fall of a scan signal. An electric current is usually supplied to a memory core portion 52 of the semiconductor device to be tested 51 by impressing stress voltage, though the stress voltage is impressed on a interface circuit portion 53 provided on the periphery, an electric current is not supplied to interior thereof. This is generally because the thickness of a silicon oxide film used for such devices as a transistor in the interface circuit portion 53 is thicker than that in the memory core 52, malfunctions occurring first on the interface circuit portion 53 is extremely rare.

Herein, a duration of time of the operation test is, for example, in the order of 100 hours and a stress voltage in a burn-in test against a memory cell of the operating voltage of 3.3 V is, for example, in the order of 5V.

However, recently, as minute semiconductor devices are produced and are highly integrated, the silicon oxide film inside the interface circuit portion is made thin, whereby causing an increased malfunctioning frequency of the interface circuit portion. Under such circumstances, for improving reliability, it became necessary to perform a burn-in test of the interface circuit portion. However, since the interface circuit portion is readily supplied with a large electric current, there is a problem in that the power consumption increases remarkably when the stress current is supplied. Also, there is a problem wherein a testing device stops operation due to the great load on a power supply provided on a test board.

SUMMARY OF THE INVENTION

It is an object of the present invention to provide a semiconductor device which can improve reliability while suppressing increased power consumption in the burn-in test, a testing device thereof, and testing method thereof.

According to one aspect of the present invention, a semiconductor device comprises a memory cell array, an interface circuit portion and a control circuit. The interface circuit portion controls input and output of a signal between the memory array and an external circuit. The control circuit controls operating states of the interface circuit portion independently of the memory cell array based on an externally inputted signal.

According to the invention, since the operating states of the interface circuit portion is controlled independently of the memory cell array based on the signals externally inputted, even when stress current is supplied to the interface circuit portion in the burn-in test, it is possible to control the duration of time thereof. Therefore, it becomes possible to test the interface circuit portion without consuming increased electricity, thus improving reliability.

Herein, the control circuit may include a stress control portion which controls the interface circuit portion so that stress due to an electric current is applied to the interface circuit portion in a burn-in test. In this case, it is preferable that the stress control portion controls the interface circuit portion so that the stress is applied to the interface circuit for a time period shorter than that of the stress to the memory cell array in the burn-in test.

Furthermore, the stress control portion may control the interface circuit portion so that the stress is applied to the interface circuit portion a plurality of times in the burn-in test, and may control the interface circuit portion so that the stress is applied to the interface circuit one time for a predetermined duration of time in the burn-in test.

According to another aspect of the present invention, a testing device of a semiconductor device comprises a test board on which a plurality of semiconductor devices are arranged in a lattice manner and a test circuit. Each of the semiconductor devices is provided with a memory cell array and an interface circuit portion. The interface circuit portion controls input and output of a signal between the memory cell array and an external circuit. The test circuit controls operating states of the interface circuit portion independently of the memory cell array, inputs a testing pattern signal to the semiconductor device, and detects an output signal from the semiconductor device.

According to the invention, since the operating states of the interface circuit portion is controlled independently of the memory cell array by the test circuit, even when a stress current is supplied to the interface circuit portion in the burn-in test, it is possible to control the duration of time thereof. Therefore, it becomes possible to test the interface circuit portion without consuming increased electricity, thus improving reliability.

According to another aspect of the present invention, a testing method of a semiconductor device is performing a burn-in test on a plurality of semiconductor devices. Each of the semiconductor devices is provided with a memory cell array and an interface circuit portion. The interface circuit portion controls input and output of a signal between the memory cell array and an external circuit. The burn-in test includes the steps of, controlling operating states of the interface circuit portion independently of the memory cell array, inputting a testing pattern signal to the semiconductor device, and detecting an output signal from the semiconductor device.

According to the invention, since the operating states of the interface circuit portion is controlled independently of the memory cell array, even when stress current is supplied to the interface circuit portion in the burn-in test, it is possible to control the duration of time thereof. Therefore, it becomes possible to test the whole semiconductor device without consuming increased electricity, thus improving reliability.

BRIEF DESCRIPTION OF THE DRAWINGS

The foregoing and other features and advantages of the present invention will become more readily more appreciated as the same becomes better understood by reference to the following detailed description when taken into conjunction with the accompanying drawings wherein.

DESCRIPTION OF THE PREFERRED EMBODIMENTS

Figure 1:
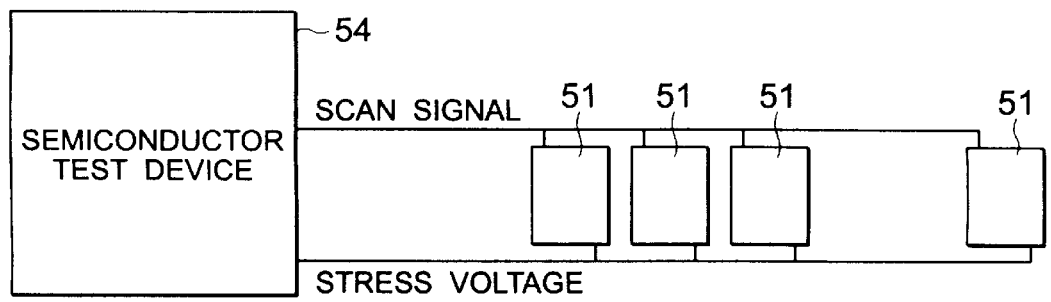
FIG. 1 is a block diagram showing a method for the operation test by the burn-in test of the conventional semiconductor device.
Figure 2:
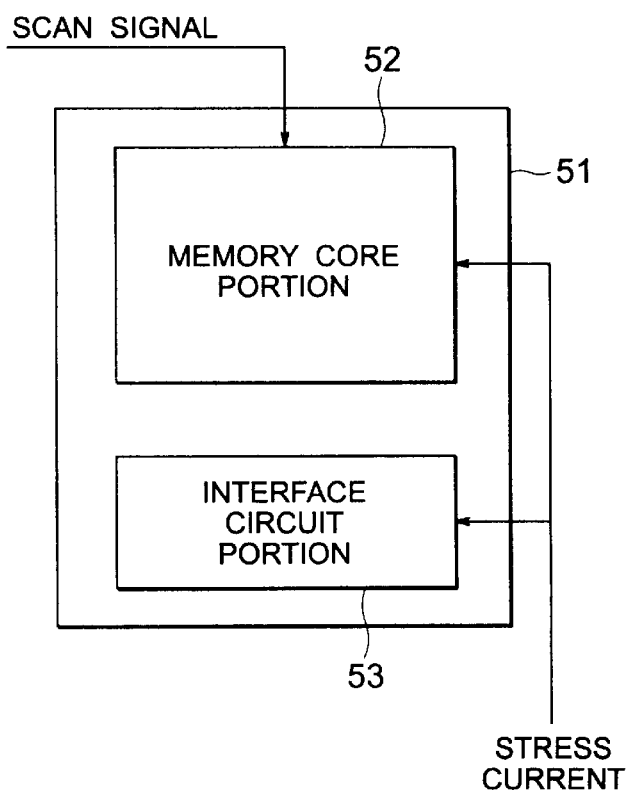
FIG. 2 is a block diagram showing a configuration of the conventional semiconductor device.
Figure 3:
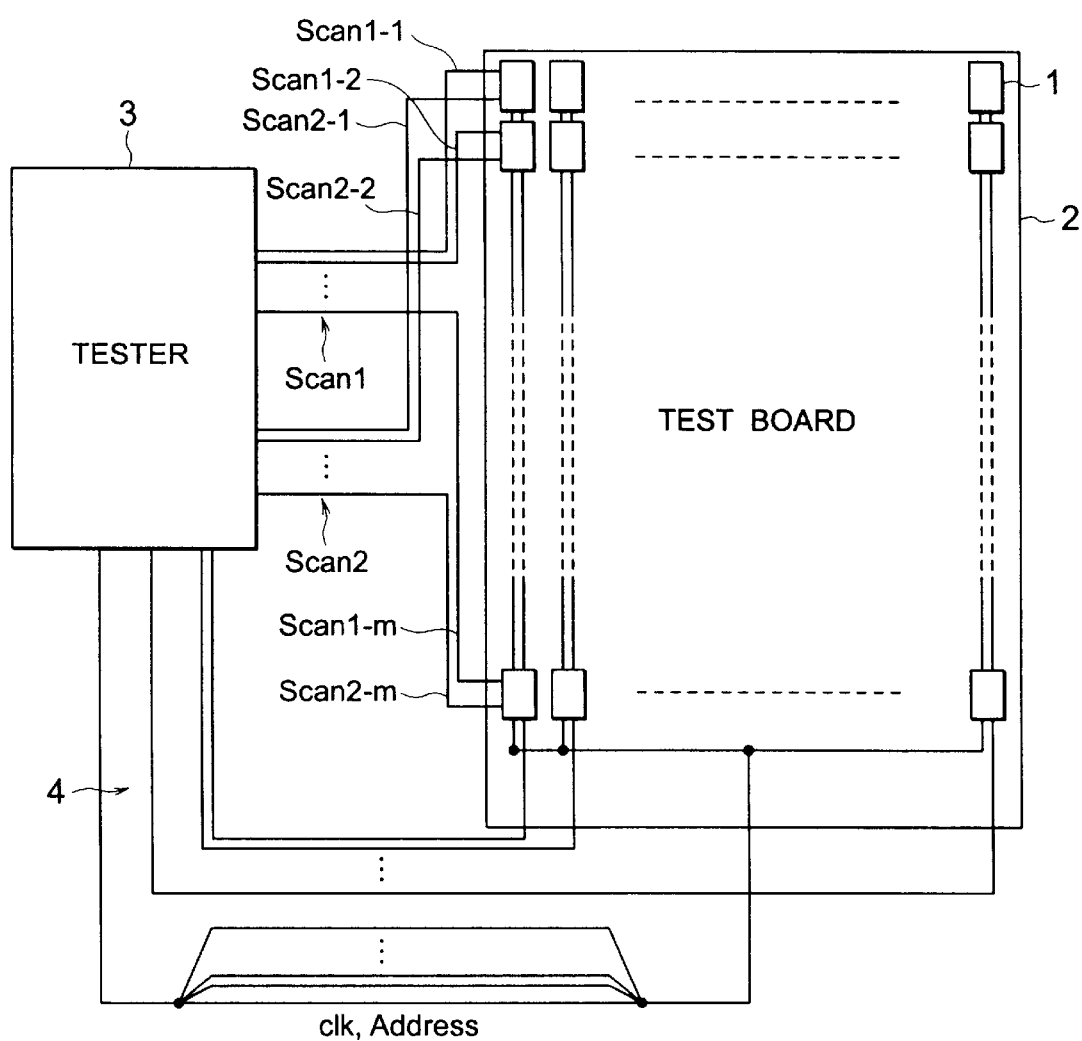
FIG. 3 is a block diagram showing a configuration of the testing device according to the first embodiment of the invention.

Hereinafter, a semiconductor device and a testing device thereof according to the embodiments of the invention are to be described in detail with reference to the attached drawings. FIG. 3 is a block diagram showing a configuration of the testing device according to the first embodiment of the invention.

In the first embodiment, a test board 2 on which a plurality of semiconductor devices 1 as devices under test (DUT) are arranged in a lattice manner of m-lines and n-rows are provided. In the test board 2, a terminal (not shown) that is connected to each semiconductor device 1 and used for impressing voltage in a burn-in test (BT) is provided. Also, a tester (test circuit) 3 for inputting a predetermined signal to the semiconductor device 1 and detecting the signal outputted from the semiconductor device 1 is provided. In the tester 3, a stress control portion (not shown) for generating scan signals, Scan 1 and Scan 2 which control the interface circuit portions so that stress due to an electric current is applied to the interface circuit portion of the predetermined semiconductor device 1 in a burn-in test is provided. To the semiconductor devices 1 composing each row on the test board 2, a common I/O signal line 4 is connected while a clock signal clk and an address signal Address are inputted. Also, to the semiconductor device 1 composing each line on the test board 2, scan signals (Scan 1-1) through (Scan 1-m) for controlling ON/OFF of input of the stress voltage in a burn-in test and scan signals (Scan 2-1) through (Scan 2-m) for controlling ON/OFF of input of the stress voltage into the interface circuit portion are inputted. In the interface circuit portion of the semiconductor device 1, for example, a clock generator, an amplifier circuit, and an external clock synchronous circuit for carrying out the delay control, waveform control, and duty ratio control and the like, are provided.

Figure 4:
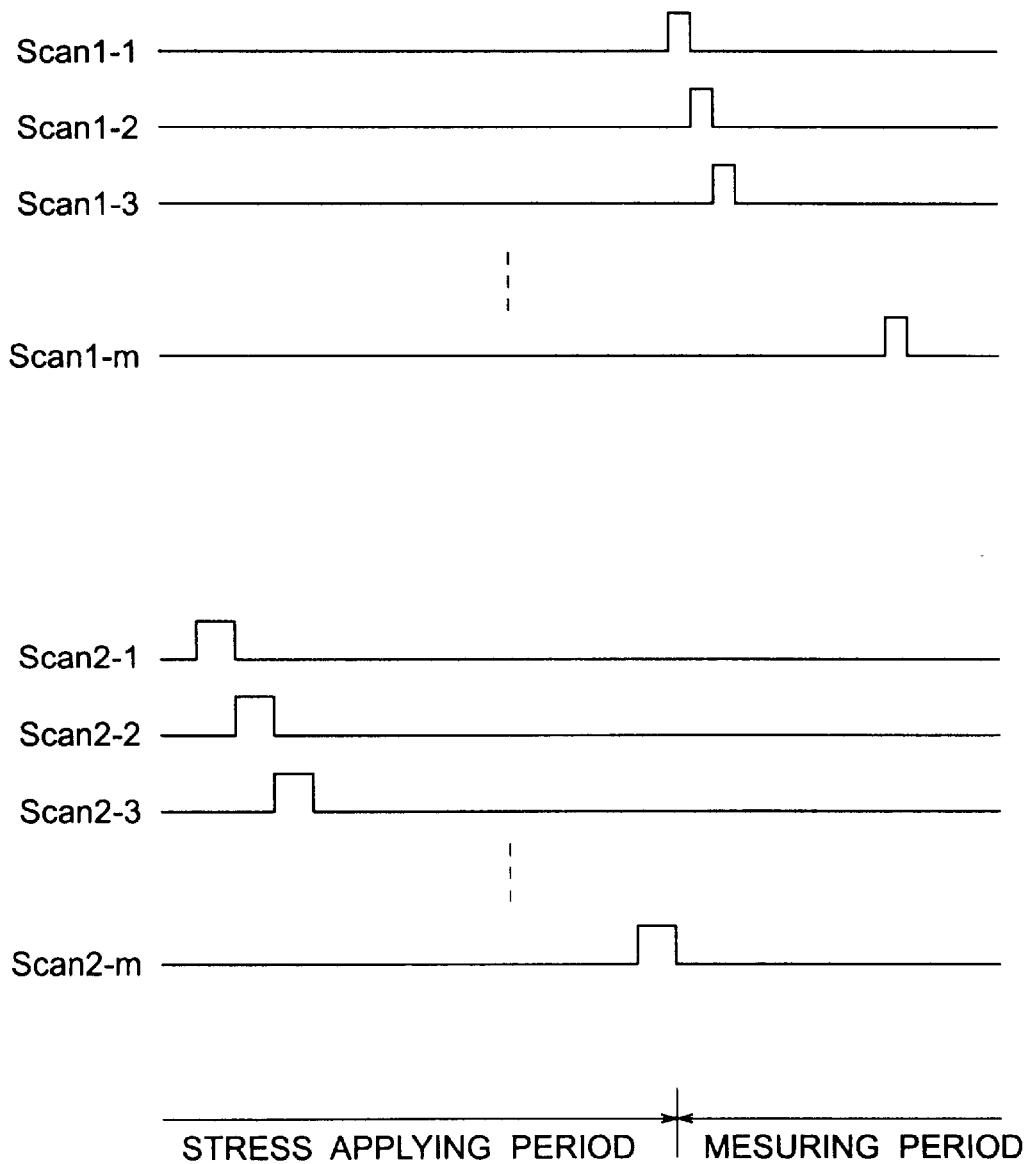
FIG. 4 is a timing chart showing operations of the testing device according to the first embodiment of the invention.

Next, operations of the testing device configured as above are described. FIG. 4 is a timing chart showing the operations of the testing device according to the first embodiment of the invention.

First, the stress voltage is impressed on the semiconductor device 1 via the test board 2 during a stress supplying period. The stress supplying period is, for example, on the order of 100 hours, however, it is not especially limited hereto. During the stress supplying period, the stress voltage is impressed at all times on the semiconductor device 1. A stress electric current is always supplied to a internal circuit of a memory core portion thereof, while to the interface circuit portion provided on the periphery, an electric current is supplied in conjunction with the scan signal Scan 2. Concretely, the scan signal (Scan 2-1) first becomes high for the fixed period as shown in FIG. 4, and a stress current is supplied to the semiconductor devices 1 of the first line during this period. Then, the scan signal (Scan 2-2) becomes high for a fixed period, and a stress current is supplied to the semiconductor devices 1 of the second line during this period. Thereafter, a scan signal Scan 2 becoming high shifts one by one and a stress current is supplied up to the semiconductor devices 1 of the m-th line.

Herein, the stress voltage is, for example, in the order of 5V of the middle level between the power supply voltage and ground voltage, however, it is not especially limited hereto.

When a stress current is supplied up to the semiconductor devices 1 of the m-th line, each scan signal Scan 2 becomes low and a measuring period starts. During the measuring period, a testing pattern signal is inputted into the semiconductor device 1 composing each line in association with the scan signals Scan 1 via the I/O signal line 4, output signals from the semiconductor devices 1 are detected by a tester 3. Concretely, the scan signal (Scan 1-1) first becomes high for a fixed period as shown in FIG. 4, and the testing pattern signal is inputted to the semiconductor devices 1 of the first line during this period. Then, the output signals from the semiconductor devices 1 of the first line are detected by the tester 3. Then, the scan signal (Scan 1-2) becomes high for the fixed period, and the testing pattern signal is inputted to the semiconductor devices 1 of the second line during this period. Then, the output signals from the semiconductor devices 1 of the second line are detected by the tester 3. Thereafter, a scan signal Scan 1 that becomes high shifts one by one and the output signals from the semiconductor devices 1 of the m-th line are detected by the tester 3.

As has been described, according to the first embodiment of the invention, the period where the stress current is supplied to the interface circuit portion to which a large current is readily supplied is much shorter than the period where the stress current is supplied to the memory core portion. Therefore, power consumption does not significantly increase. Additionally, since the interface circuit portion does not develop faults as easily as the memory core portion, such a period of stressing is sufficiently long for the burn-in test of the interface circuit portion. Therefore, while preventing great increases in power consumption, a highly reliable semiconductor device can be selected.

Moreover, in the first embodiment of the invention, scan signals (Scan 2-1) through (Scan 2-m) directly control ON/OFF of the stress voltage in the interface circuit portion, however by providing a control circuit wherein respective scan signals (Scan 2-1) through (Scan 2-m) are inputted into each semiconductor device, it may be arranged so that an enabling signal for controlling ON/OFF of the stress current is generated from this control circuit. For example, the enabling signal may be generated by allowing the control circuit to convert the level of the scan signal Scan 2, or the enabling signal may be generated by dividing one scan signal 2 into a plural number.

Figure 5:
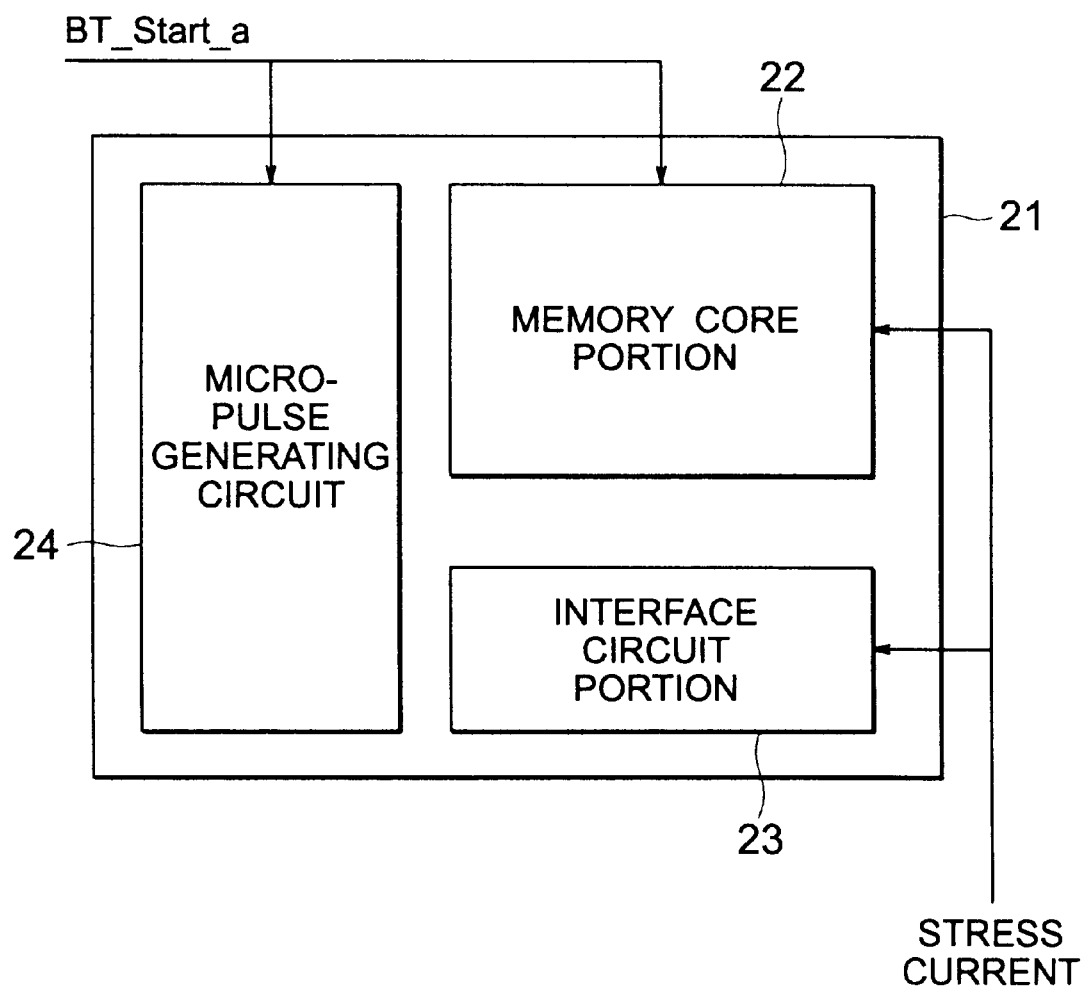
FIG. 5 is a block diagram showing a configuration of the semiconductor device according the second embodiment of the invention.
Figure 6:
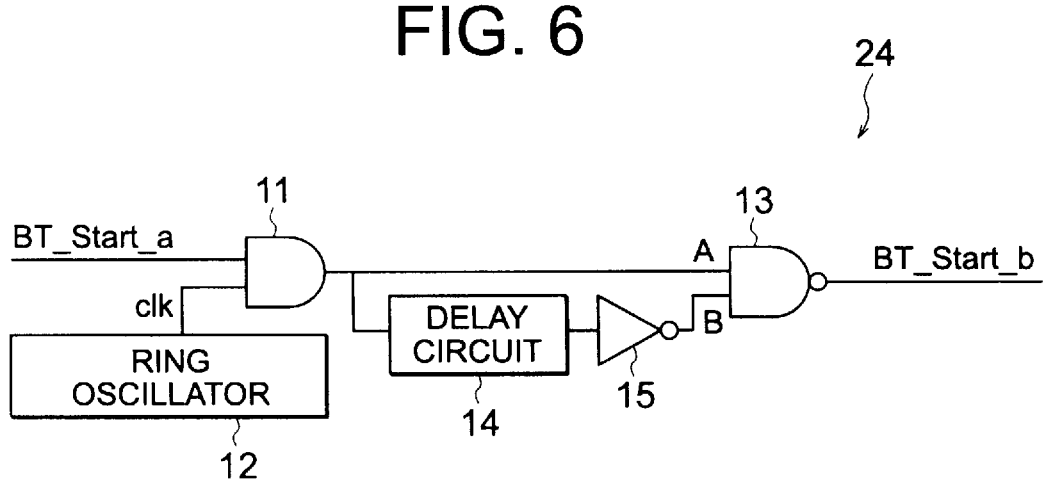
FIG. 6 is a block diagram showing a configuration of the micro-pulse generating circuit provided in the semiconductor device according the second embodiment of the invention.

Then, a semiconductor device according to the second embodiment of the invention is described. In the second embodiment, scan signals for controlling ON/OFF of input of the stress voltage from the tester into the interface circuit portion are not inputted. On the other hand, a micro-pulse generating circuit for generating micro-pulses for controlling ON/OFF of input of the stress voltage into the interface circuit portion in association with the signal indicating the start of the burn-in test is provided. FIG. 5 is a block diagram showing a configuration of the semiconductor device according the second embodiment of the invention and FIG. 6 is a block diagram showing a configuration of a micro-pulse generating circuit provided in the semiconductor device according the second embodiment of the invention.

In the semiconductor device 21 according to the second embodiment, a memory core portion 22 such as a memory cell array and the like is provided. Around the memory core portion 22, an interface circuit portion 23, which functions as an interface between the memory core portion 22 and an external circuit. Furthermore, a micro-pulse generating circuit 24 which generates micro-pulse for controlling ON/OFF of input of the stress voltage into the interface 23 in association with the start signal BT_Start_a of the burn-in test.

In the micro-pulse generating circuit 24, an AND gate 11 where the burn-in test start signal BT_Start_a outputted from the test board is inputted into one input terminal thereof. Into the other input terminal of the AND gate 11, a clock signal clk outputted from a ring oscillator 12 is inputted. An output signal from the AND gate 11 is branched into two and one thereof is inputted into one input terminal of a NAND gate 13. The other branched signal is inputted into a delay circuit 14. To the delay circuit 14, an input terminal of a inverter 15 is connected and an output terminal of the inverter 15 is connected to the other input terminal of the NAND gate 13. The stress control portion for controlling an interface circuit portion 23 is configured of these components.

Herein, an internal clock signal (not shown) or a signal externally inputted (not shown) used by the interface circuit portion may be used in place for the clock signal outputted from the ring oscillator 12.

Figure 7:
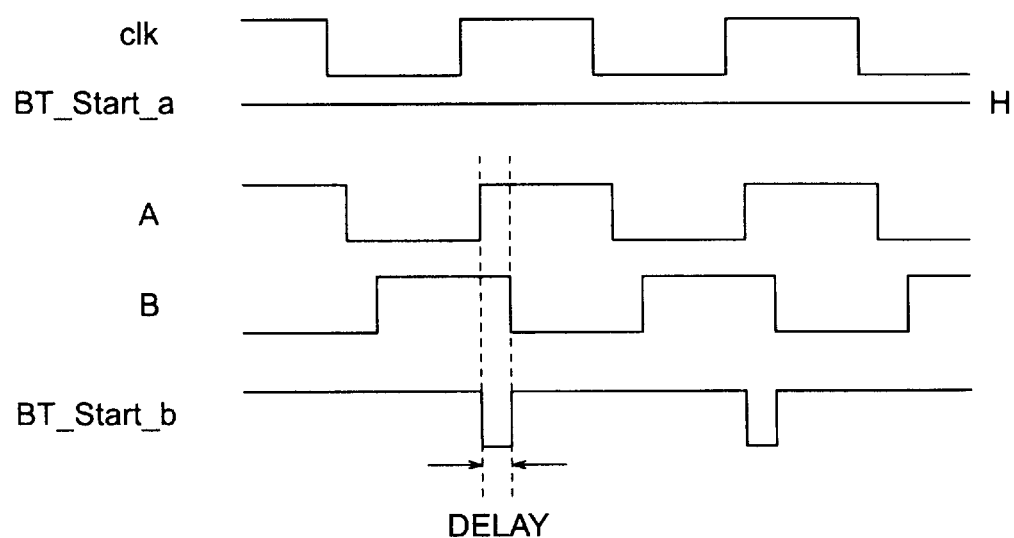
FIG. 7 is a timing chart showing operations of the testing device according to the second embodiment of the invention.

Then, operations in the burn-in test of the semiconductor device of the second embodiment configured as described above are explained. FIG. 7 is a timing chart showing operations of the semiconductor device according to the second embodiment of the invention.

On the semiconductor device attached to the test board, stress voltage is impressed from the test board. Also, the clock signal clk is inputted into the AND gate 11 from the ring oscillator 12. Then, at the beginning of the burn-in test, the start signal BT_Start_a becomes high. Accordingly, stress current is supplied to the memory core portion of the semiconductor device. This stress current is supplied at all times during the stress supplying period.

Moreover, the start signal BT_Start_a becomes high, whereby the output signal of the AND gate 11 repeats high/low with a slight delay from the clock signal clk. Then, one branched output signal (A) is inputted into the NAND gate 13 as it is. On the other hand, the other branched output signal is inputted into the delay circuit 14 to be delayed, then inputted into the inverter 15. Then, the signal (B) reversed by the inverter 15 is inputted into the NAND gate 13. NAND logic of two signals is gained by the NAND gate 13 and the result is to be outputted as a burn-in test start signal BT_Start_b of the interface circuit portion. Then, a stress current is supplied in the interface circuit portion in the period where this start signal BT_Start_b is low. As shown in FIG. 7, micro-pulse delay by the delay circuit 14 is generated in the start signal BT_Start_b. Therefore, the time period where the stress current is supplied in the interface circuit portion is extremely short. Accordingly, the increase in power consumption is not large. Additionally, since the interface circuit portion 23 does not develop faults as easily as the memory core portion 22, an even shorter stressing period than the stressing period against the memory core is sufficient for the burn-in test of the interface circuit portion 23. Therefore, according to the second embodiment, while preventing great increases in power consumption, a highly reliable semiconductor device can be selected.

When the micro-pulse is generated, as described above, stress current is supplied to the interface circuit portion 23 from the test board. This stress current is supplied, for example, due to discharging electrical charge charged in a condenser for a power supply. In this case, the electrical charge charged in the condenser reduces, however, the time period is extremely short and enough time before the next discharge is secured. Therefore, it is possible to charge electrical charge within that time period. Accordingly, still in this case, the load on the power supply does not increase.

What is claimed is:

1. A semiconductor device comprising:
   a memory cell array;
   an interface circuit portion which controls input and output of a signal between said memory array and an external circuit; and
   a control circuit which controls operating states of said interface circuit portion independently of said memory cell array based on an externally inputted signal;
   wherein said control circuit comprises a stress control portion which controls said interface circuit portion so that stress due to an electric current is applied to said interface circuit portion in a burn-in test.

2. The semiconductor device as set forth in claim 1, wherein said stress control portion controls said interface circuit portion so that said stress is applied to said interface circuit for a time period shorter than that of said stress to said memory cell array in said burn-in test.

3. The semiconductor device as set forth in claim 2, wherein said stress control portion controls said interface circuit portion so that said stress is applied to said interface circuit portion a plurality of times in said burn-in test.

4. The semiconductor device as set forth is claim 2, wherein said stress control portion controls said interface circuit portion so that said stress is applied to said interface circuit one time for a predetermined duration of time in said burn-in test.

5. A testing device of a semiconductor device comprising:
   a test board on which a plurality of semiconductor devices are arranged in a lattice manner, each of said semiconductor devices being provided with a memory cell array and an interface circuit portion, said interface circuit portion controlling input and output of a signal between said memory cell array and an external circuit; and
   a test circuit which controls operating states of said interface circuit portion independently of said memory cell array, inputs a testing pattern signal to said semiconductor device, and detects an output signal from said semiconductor device;

wherein said test circuit comprises a stress control portion which controls said interface circuit portion so that stress due to an electric current is applied to said interface circuit portion in a burn-in test.

6. The testing device as set forth in claim 5, wherein said stress control portion controls said interface circuit portion so that said stress is applied to said interface circuit for a time period shorter than that of said stress to said memory cell array in said burn-in test.

7. The testing device as set forth in claim 6, wherein said stress control portion controls said interface circuit portion so that said stress is applied to said interface circuit portion a plurality of times in said burn-in test.

8. The testing device as set forth in claim 6, wherein said stress control portion controls said interface circuit portion so that said stress is applied to said interface circuit one time for a predetermined duration of time in said burn-in test.

9. A testing method of a semiconductor device performing a burn-in test on a plurality of semiconductor devices, each of said semiconductor devices being provided with a memory cell array and an interface circuit portion, said interface circuit portion controlling input and output of a signal between said memory cell array and an external circuit, said burn-in test including the steps of:

controlling operating states of said interface circuit portion independently of said memory cell array;

inputting a testing pattern signal to said semiconductor device; and detecting an output signal from said semiconductor device;

wherein said controlling operating states of said interface circuit portion comprises controlling said interface circuit portion so that stress due to an electric current is applied to said interface circuit portion in said burn-in test.

10. The testing method as set forth in claim 9, wherein said controlling operating states of said interface circuit portion comprises controlling said interface circuit portion so that said stress is applied to said interface circuit for a time period shorter than that of said stress to said memory cell array in said burn-in test.

11. The testing method as set forth in claim 10, wherein said controlling operating states of said interface circuit portion comprises supplying an electric current to said interface circuit portions of all of said semiconductor devices a plurality of times in said burn-in test.

12. The testing device as set forth in claim 10, wherein said controlling operating states of said interface circuit portion comprises supplying an electric current to said interface circuit portions of each predetermined number of said semiconductor devices one time for a predetermined duration of time in said burn-in test.

* * * * *